United States Patent [19]
Maier et al.

[11] Patent Number: 5,880,506
[45] Date of Patent: Mar. 9, 1999

[54] SOLID-STATE SWITCHING ELEMENT WITH TWO SOURCE ELECTRODES AND SOLID-STATE SWITCH WITH SUCH AN ELEMENT

[75] Inventors: Reinhard Maier, Herzogenaurach; Hermann Zierhut, deceased, late of Neutraubling, Ingeborg Zierhut, Legal Representative; Heinz Mitlehner, Uttenreuth; Ingeborg Zierhut, Neutrabling, all of Germany

[73] Assignee: Siemens Aktiengesellschaft, München, Germany

[21] Appl. No.: 836,339

[22] PCT Filed: Oct. 28, 1994

[86] PCT No.: PCT/DE94/01271

§ 371 Date: Oct. 14, 1997

§ 102(e) Date: Oct. 14, 1997

[87] PCT Pub. No.: WO96/13859

PCT Pub. Date: May 9, 1996

[51] Int. Cl.[6] .......................... H01L 29/76; H01L 29/94; H01L 31/062; H01L 31/113

[52] U.S. Cl. .............................. 257/401; 257/77; 257/379; 327/427; 327/429; 327/436; 327/562; 327/563; 327/566

[58] Field of Search ............................. 257/379, 77, 401; 327/427, 429, 436, 562, 563, 566

[56] References Cited

U.S. PATENT DOCUMENTS 5,714,782  2/1998  Nakagawa et al. ...................... 257/343

*Primary Examiner*—Ngân V. Ngô
*Attorney, Agent, or Firm*—Kenyon & Kenyon

[57] ABSTRACT

A solid-state switching element that works with at least one semiconductor region or a pair of antiserially arranged semiconductor regions having characteristic curves similar to those of FETs. An internal body diode in inverse operation is also provided. In addition to having a drain and a gate, each of the semiconductor regions has two source electrodes, with several cells combined with the electrodes in cell design. One source serves as a load current electrode, called a load source, and the other source is available as a gate electrode, called a control source. The effective semiconductor region of the load source is larger than the effective semiconductor region of the control source.

9 Claims, 3 Drawing Sheets

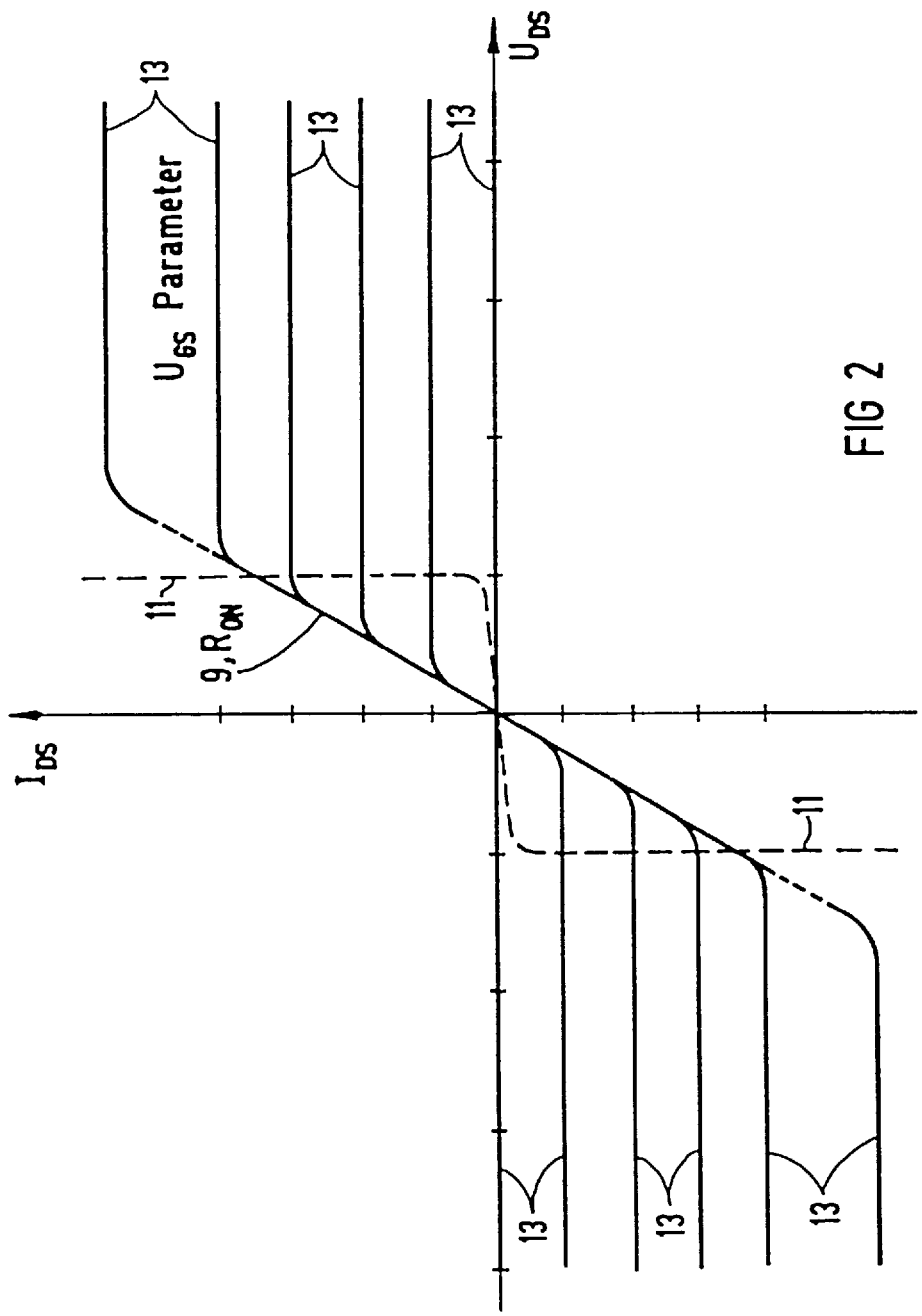

SOLID-STATE SWITCHING ELEMENT WITH TWO SOURCE ELECTRODES AND SOLID-STATE SWITCH WITH SUCH AN ELEMENT

FIELD OF THE INVENTION

The present invention relates to first a solid-state switching element that works with at least one semiconductor region, a pair of antiserially arranged semiconductor regions or more semiconductor regions with characteristic curves similar to those of FETs. Therefore, they also have internal body diodes in inverse operation.

BACKGROUND INFORMATION

In switching operations in electric circuits, the current flowing through a circuit is switched off when it exceeds a predetermined maximum, depending on the size of the current flowing through the circuit without resulting in a great overload current. With electronic switches, this problem is usually solved by measuring the voltage drop at a resistor as a triggering criterion, with a controller logic triggering a protective system to interrupt the circuit. Instead of a resistor, current transformers are also used. With electromagnetic circuit-breakers, an armature of a coil through which current is flowing operates on a breaker mechanism to open contacts in the conductors to be disconnected. With all such arrangements, the current may still assume a high value until disconnected due to the operating delay after a short-circuit has occurred.

SUMMARY OF THE INVENTION

The object of the present invention is to develop a solid-state switching element that will permit switching that is relatively free of delay.

This object is achieved according to the present invention with a solid-state switching element. The semiconductor regions, in particular in the cell design, each have two electron donors or sources in addition to an electron collector or drain and an electrode or gate that controls the flow of electrons. These electrodes are combined in cell design. The effective semiconductor area connected to the first source, which is available as the load current electrode or load source, is larger than that connected to the second source, which is available as the gate electrode or the control source. Depending on the area ratio of the layout, the current carried over the control source may be reduced in relation to the load source; such a current is more easily generated and processed using electronic means.

An advantageous ratio of the semiconductor area of the load source to that of the control source is $10^2$:1 through $10^4$:1. The semiconductor regions are preferably made of a material that can withstand an operating temperature of 300° C. to 600° C. A suitable material is silicon carbide, SiC.

The solid-state switching element may be designed so that the control source is arranged at the center of a surrounding load source field. The load source may be arranged in a ring around the control source.

The solid-state switching element may accommodate other elements, e.g., an ohmic resistor, in integrated chip technology. A resistor is preferably inserted electrically as an additional element between the load source and control source.

Solid-state switches can easily be constructed from such solid-state switching elements. According to another embodiment of a solid-state switch with an element having two semiconductor regions, the control sources are connected to the negative input of an operational amplifier and the load sources are connected to the positive input. Regarding the potential, an ohmic resistor is inserted between the two terminals, where the gate electrodes of the two semiconductor regions are connected to the output of the operational amplifier. The drain electrodes of the two semiconductor regions are available as load terminals. Such a solid-state switch can be integrated advantageously in a chip or it may work with discrete components. For higher switching capacities, the semiconductor regions may be mounted on a heat sink.

BRIEF DESCRIPTION OF THE DRAWINGS

FIG. 2 shows a characteristics field of the solid-state element shown in FIG. 1.

Figure 1:
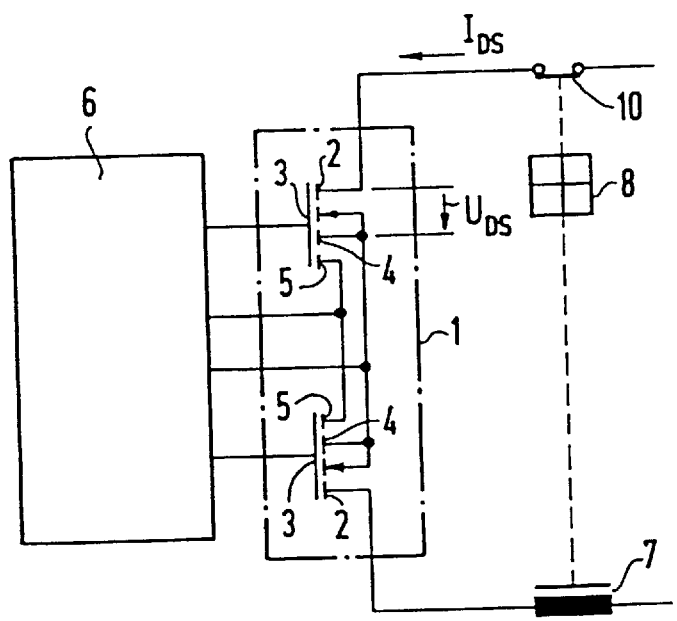
FIG. 1 shows a solid-state switching element in combination with a control unit and an electromagnetic switch according to the present invention.

Solid-state switching element 1 according to FIG. 1 has two antiserially arranged semiconductor regions, each of which has characteristic curves similar to those of FETs. Each semiconductor region has an electron collector or drain 2, an electrode or gate 3 that controls the flow of electrons and two electron donors, source 4 and source 5, where the first source is available as a load current electrode or load source 4 and the second source is available as a gate electrode or control source 5. A control unit 6 shows how solid-state switching element 1 can be controlled. The control unit 6 can be used in conjunction with an electromagnetic circuit-breaker. The electromagnetic circuit-breaker is illustrated with an electromagnetic tripping device 7 and a breaker mechanism 8 that acts on switching contacts 10.

FIG. 2 shows a characteristics field, illustrating with the family 13 of characteristics in the first quadrant the behavior of a semiconductor region for a drain-source current $I_{DS}$ and a drain-source voltage $U_{DS}$ as a function of the gate-source voltage $U_{GS}$ as a parameter. The OFF state is represented by the abscissa. With an increase in gate-source voltage $U_{GS}$ the characteristic curves 13 approach a straight line 9, $R_{ON}$, beginning at the origin. In another analysis, a steep characteristic curve 9 is achieved at a high gate-source voltage; this curve is generally understood to be the ON resistance because it indicates a linear relationship between current and voltage. A steep line 9 corresponds to a low ON resistance. With an antiserial circuit arrangement of two semiconductor regions, characteristic curves 13 and $R_{ON}$ are located in the first and third quadrants. The body diode in inverse operation yields a superimposition of the characteristics field with a characteristic curve 11 in the third quadrant to characteristics field 13 in the first quadrant and a characteristic curve 11 in the first quadrant to characteristics field 13 in the third quadrant.

DETAILED DESCRIPTION OF THE INVENTION

When there is a single semiconductor region, characteristic curves 13 in the first quadrant are supplemented by characteristic curve 11 of the body diode in the third quadrant. This characteristic curve 11 illustrates the fact that the body diode acts in parallel to the working path of the semiconductor region in the mode of an FET in reverse direction. With one semiconductor region, voltage of a potential type can be switched or limited, and with two antiserially connected semiconductor regions, it is also possible to switch an a.c. voltage, i.e., a voltage between two potentials.

Figure 3:
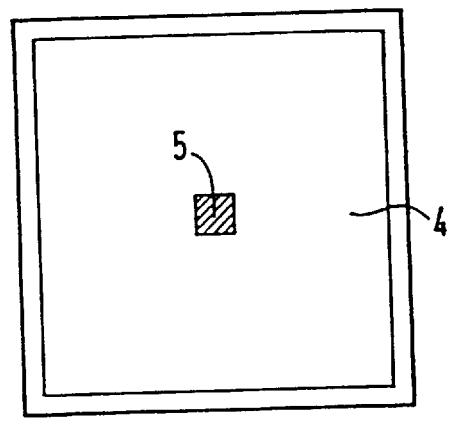
FIG. 3 illustrates a design layout of a solid-state switching element according to the present invention.
Figure 4:
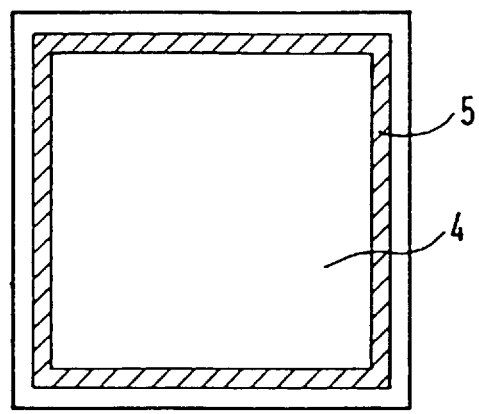
FIG. 4 illustrates another design layout of the solid-state switching element according to the present invention.

FIG. 3 illustrates one embodiment of the layout of a solid-state switching element, where control source 5 is arranged centrally in a surrounding field of load source 4. FIG. 4 illustrates another embodiment, where control source 5 is arranged in a ring around load source 4.

Figure 5:
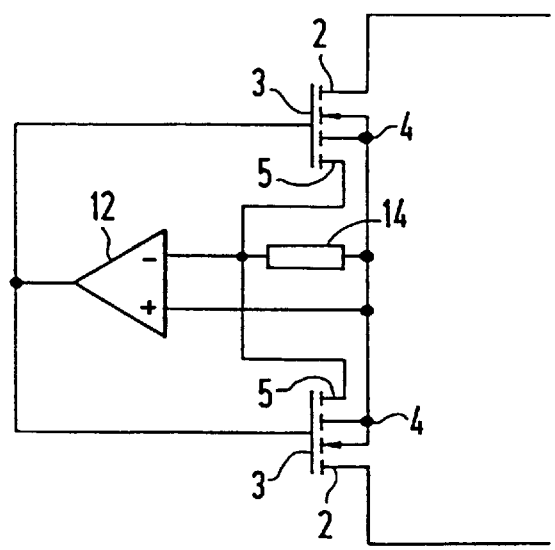
FIG. 5 illustrates the electric circuit arrangement according to one embodiment of the present invention for a solid-state switch with the solid-state switching element.

The solid-state switch according to FIG. 5 works with two semiconductor regions of the type described above in an antiserial arrangement. Control source 5 is connected to the negative input of an operational amplifier 12, and load source 4 is connected to the positive input, with an ohmic resistor 14 inserted with regard to the potential between the two terminals. Gate electrodes 3 of the two semiconductor regions are connected to the output of operational amplifier 12 with drain electrodes 2 of the two semiconductor regions being available as load terminals. Due to the divided load current, which is reduced according to the ratio of the effective semiconductor areas of load source to control source, there is a voltage drop at resistor 14 that, by means of operational amplifier 12 or a comparator, prepares the gate voltage required by the semiconductor regions with the characteristic curves of an FET to limit the current so that the semiconductor regions are switched to a current-blocking state. The semiconductor regions may be designed in particular as MOSFETs and may be made of SiC.

What is claimed:

1. A solid-state switching element comprising:
   a plurality semiconductor regions, each of the plurality of semiconductor regions including a first source, a second source, a drain and a gate, the gate controlling the flow of electrons, each of the plurality of semiconductor regions having characteristic curves corresponding to curves of FETs and internal body diodes in an inverse operation;
   a first effective semiconductor area connected to the first source; and
   a second effective semiconductor area connected to the second source supplying a control signal,
   wherein the first effective semiconductor area is larger than the second effective semiconductor area.

2. The solid-state switching element according to claim 1, wherein a ratio of the first semiconductor area to the second semiconductor area ranges from $10^2:1$ to $10^4:1$, and wherein the plurality of semiconductor regions are composed of a material that withstands an operating temperature ranging between 300° C. and 600° C.

3. The solid-state switching element according to claim 1, wherein the plurality of semiconductor regions are composed of silicon carbide (SiC).

4. The solid-state switching element according to claim 1, wherein the second source of each of the plurality of semiconductor regions is positioned substantially at the center of the first respective source.

5. The solid-state switching element according to claim 1, wherein the second source of each of the plurality of semiconductor regions is positioned substantially in a ring shape around the first respective source.

6. The solid-state switching element according to claim 1, further comprising:
   an ohmic resistor coupled between the first source and the second source.

7. The solid-state switching element according to claim 1, wherein the plurality of semiconductor regions are composed of silicon carbide (SiC).

8. A solid-state switch comprising:
   a solid-state switching element including:
      a plurality semiconductor regions, each of the plurality of semiconductor regions including a first source, a second source, a drain and a gate, the gate controlling the flow of electrons, each of the plurality of semiconductor regions having characteristic curves corresponding to curves of FETs and internal body diodes in an inverse operation,
      a first effective semiconductor area connected to the first source, and
      a second effective semiconductor area connected to the second source supplying a control signal, wherein the first effective semiconductor area is larger than the second effective semiconductor area;
   an operational amplifier having a positive input connected to the first source of each of the plurality of semiconductor regions, a negative input connected to the second source of each of the plurality of semiconductor regions, and an output; and
   an ohmic resistor coupled between the first source and the second source,
   wherein the gate of each of the plurality of semiconductor regions is connected to the output of the operational amplifier, and
   wherein the drain of each of the plurality of semiconductor regions is available as a load terminal.

9. The solid-state switch according to claim 8, wherein the semiconductor regions are mounted to a heat sink.

* * * * *